United States Patent
Chen et al.

(10) Patent No.: US 6,867,309 B2
(45) Date of Patent: Mar. 15, 2005

(54) RED-EMITTING ORGANIC ELECTROLUMINESCENT COMPOUND

(75) Inventors: Ruey-Min Chen, Keelung (TW); Jun-Wen Chung, Kaohsiung (TW); Chun-Che Hsu, Taipei (TW)

(73) Assignees: Chi Mei Optoelectronics Corporation, Tainan (TW); Kyocera Corporation, Kyoto (JP)

( * ) Notice: Subject to any disclaimer, the term of this patent is extended or adjusted under 35 U.S.C. 154(b) by 0 days.

(21) Appl. No.: 10/313,639

(22) Filed: Dec. 5, 2002

(65) Prior Publication Data

US 2003/0127975 A1 Jul. 10, 2003

(30) Foreign Application Priority Data

Jan. 8, 2002 (TW) .......................... 91100133 A

(51) Int. Cl.$^7$ .......................... C07D 309/34; H05B 33/00
(52) U.S. Cl. .......................... 549/426; 549/356; 428/917
(58) Field of Search ................ 549/356, 426; 428/917

(56) References Cited

U.S. PATENT DOCUMENTS 5,935,720 A * 8/1999 Chen et al. .................. 428/690

OTHER PUBLICATIONS

CA 130:117414, Goto et al. 1999.*
Silverstein et al. *Spectrometric Identification of Organic Compounds 4th Edition*. pp. 311–312, 326 (1981).

GuHongShou. *Optoelectronic OLED Technology and Application*. pp. 96–96 (2001).

* cited by examiner

Primary Examiner—Ceila Chang
Assistant Examiner—Janet L Coppins
(74) Attorney, Agent, or Firm—Merchant & Gould P.C.

(57) ABSTRACT

A red-emitting organic electroluminescent compound, the structure of the compound as follows:

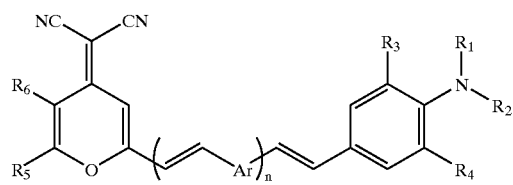

wherein n is an integer of 1~6; Ar represents aryl or heteroaryl; $R_1$ and $R_2$ individually represent alkyl of from 1 to 20 carbon atoms, aryl, carbocyclic and other heterocyclic systems;

$R_3$ and $R_4$ individually represent hydrogen, alkyl of from 1 to 10 atoms, branched or unbranched 5 or 6 member substituent ring connecting respectively with $R_1$ and $R_2$, or alkyl methyl silane group;

$R_5$ represents alkyl of from 1 to 20 atoms, aryl, or heteroaryl; and $R_6$ represents alkyl of from 1 to 10 atoms, and a 5 or 6-member carbocyclic ring connecting with $R_5$.

4 Claims, 4 Drawing Sheets

RED-EMITTING ORGANIC ELECTROLUMINESCENT COMPOUND

BACKGROUND OF THE INVENTION

1. Field of the Invention

The present invention relates to a red-emitting organic electroluminescent compound. In particular, the invention involves a red-emitting organic electroluminescent compound that is capable of increasing the purity of red light.

2. Description of the Prior Art

In recent years, organic electroluminescent devices (OELDs) have been developed to become highly efficient and capable of producing a wide range of colors. As a result, the scope of OELD application has become even more versatile, such as flat panel electronic displays.

Organic light emitting devices (OLEDs) employ electroluminescence induced by applying a voltage to inject carriers to organic material that is luminescent. In FIG. 1, a basic OLED device is composed of an organic and luminescent material 4 formed between an upper metal cathode 2 and a lower transparent anode 6. The entire device is formed on a transparent substrate 8 (such as glass), and the transparent anode 6 is usually conductive ITO (Indium Oxide doped with Tin). FIG. 2 shows the energy gap of the device shown in FIG. 1. When a forward bias is applied between the anode 6 and the cathode 2, holes (+) and electrons (−) are injected to the organic semiconductor from anode 6 and cathode 2. Two carriers meet while transported in the organic thin film. Photons are produced by radiative recombination, thus the device emits light 10 via transparent anode and transparent substrate. In 1987, Kodak Co. proposed a breakthrough double layer device, shown in FIG. 3. 12 represents a metal cathode (MgAg), 14 represents an electron-transport layer ($Alq_3$), 16 represents a hole-transport layer (diamine), 18 represents a transparent anode (ITO), and 20 represents a transparent substrate (glass). Structural formulas for $Alq_3$ of the electron-transport layer 14 and diamine of the electron hole-transport layer 16 are respectively shown in FIGS. 4a and 4b. A device having this structure allows for separation of various functions on different layers. For instance, hole-transport layer 16 is in charge of injecting holes and transporting, and electron-transport layer 14 is in charge of injecting electrons and transporting. It is observed from the energy gap of the double-layer device shown in FIG. 5 that spacial distribution of carriers is limited by energy barriers located at heterojunctions, thereby increasing the frequency for combining carrier radiation. The double-layer device of Kodak has been extended further to multi-layer structure, where injecting electrons, transporting electrons, injecting holes, transporting holes and light emission caused by combining carrier radiation are spreaded on different material layers.

In earlier times, organic electroluminescent material used in OLED was mainly conjugated from organic host materials and conjugated organic activating agent having condensed benzene rings. However, researchers have found that doping a small amount of highly effective emissive dopant in the electroluminescent host material improves the efficiency for radiative combination of carriers. That is, doping various colours, such as red, green, and blue organic electroluminescent material in organic host material to obtain required electroluminescence.

However, for current organic electroluminescent technology, efficiency and purity for red light are the lowest, since they deviate to yellow or orange. For example, U.S. Pat. No. 5,935,720 discloses a red-emitting material DCJTB with λ em=615 nm (as shown in FIG. 1 of the patent), consequently its light appears orange. Furthermore, efficiency is lowered due to concentration quenching effect. Although there has been a proposal for phosphorous red-emitting material, it is not ideal in terms of efficiency due to longer decay time and lower thermal stability. As a result, it is critical to develop red-emitting material for organic electroluminescent elements.

SUMMARY OF THE INVENTION

In order to overcome the above problems, one object of the invention is to provide a red-emitting organic electroluminescent compound, having the following structural formula:

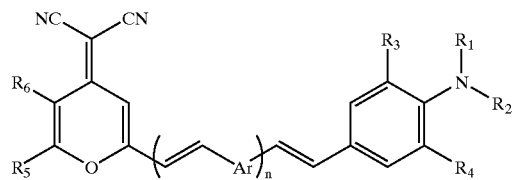

wherein n is an integer of 1~6;

Ar represents aryl or heteroaryl;

$R_1$ and $R_2$ individually represent alkyl of from 1 to 20 carbon atoms, aryl, carbocyclic and other heterocyclic systems;

$R_3$ and $R_4$ individually represent hydrogen, alkyl of from 1 to 10 atoms, branched or unbranched 5 or 6 member substituent ring connecting respectively with $R_1$ and $R_2$, or alkyl methyl silane group;

$R_5$ represents alkyl of from 1 to 20 atoms, aryl, or heteroaryl; and $R_6$ represents alkyl of from 1 to 10 atoms, and a 5 or 6-member carbocyclic ring connecting with $R_5$.

Examples of $R_1$ and $R_2$ are methyl, ethyl, propyl, n-butyl, aryl or heteroaryl. Preferable aryl and heteroaryl are substituted or unsubstituted phenyl, biphenyl, naphthyl, anthracenyl, furyl, thienyl, pyridinyl or other heteroaryls. $R_3$ and $R_4$ represent hydrogen atom, methyl, ethyl, propyl, iso-propyl, n-butyl, iso-butyl, neobutyl, neopentyl or $R_3$ and $R_4$ are arranged respectively with $R_1$ and $R_2$ as follows $R_1$–$R_3$, $R_2$–$R_4$=[$CH_2CH_2$], [$CH_2CH_2CH_2$], [$CH_2CH_2C(CH_3)_2$]. $R_5$ is methyl, ethyl, propyl, iso-propyl, n-butyl, iso-butyl, neobutyl, neopentyl or other aryl having greater steric hindrance, such as l-naphthyl, 9-anthracenyl, pyrenyl, perylenyl, ortho-substituted aryl or substituted carbocyclic ring connecting $R_5$ and $R_6$, to form the following structure $R_5$, $R_6$=(—$CH_2CH_2CH_2$—) and (—$CH_2CH_2CH_2CH_2$—).

By having arylenevinylene as repeating units in the compound shown above, conjugation of material is increased and energy gap is lowered. Consequently, emitted wavelength is located in the red light zone, thereby increasing its color purity and lowering concentration quench effect.

It is another object of the invention to provide an organic electroluminescent element, comprising a cathode, an anode, and at least an emitting layer containing the following compound interposed between the cathode and the anode:

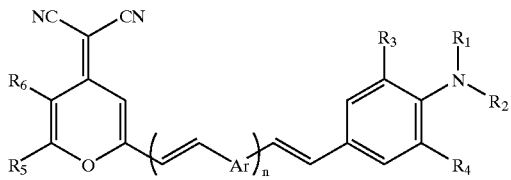

wherein n is an integer of 1~6;
Ar represents aryl or heteroaryl;
$R_1$ and $R_2$ individually represent alkyl of from 1 to 20 carbon atoms, aryl, carbocyclic and other heterocyclic systems;
$R_3$ and $R_4$ individually represent hydrogen, alkyl of from 1 to 10 atoms, branched or unbranched 5 or 6 member substituent ring connecting respectively with $R_1$ and $R_2$, or alkyl methyl silane group;
$R_5$ represents alkyl of from 1 to 20 atoms, aryl, or heteroaryl; and
$R_6$ represents alkyl of from 1 to 10 atoms, and a 5 or 6-member carbocyclic ring connecting with $R_5$.

Examples of $R_1$ and $R_2$ are methyl, ethyl, propyl, n-butyl, aryl or heteroaryl. Preferable aryl and heteroaryl are substituted or unsubstituted phenyl, biphenyl, naphthyl, anthracenyl, furyl, thienyl, pyridinyl or other heteroaryls. $R_3$ and $R_4$ represent hydrogen atom, methyl, ethyl, propyl, iso-propyl, n-butyl, iso-butyl, neobutyl, neopentyl or $R_3$ and $R_4$ are arranged respectively with $R_1$ and $R_2$ as follows $R_1$–$R_3$, $R_2$–$R_4$=[$CH_2CH_2$], [$CH_2CH_2CH_2$], [$CH_2CH_2C(CH_3)_2$]. $R_5$ methyl, ethyl, propyl, iso-propyl, n-butyl, iso-butyl, neobutyl, neopentyl or other aryl having greater three dimensional barrier, such as 1-naphthyl, 9-anthracenyl, pyrenyl, perylenyl, ortho-substituted aryl or substituted carbocyclic ring connecting $R_5$ and $R_6$, to form the following structure $R_5$, $R_6$=(—$CH_2CH_2CH_2$—) and (—$CH_2CH_2CH_2CH_2$—).

The present invention will become more fully understood from the detailed description given hereinbelow and the accompanying drawings, given by way of illustration only and thus not intended to be limitative of the present invention.

DETAILED DESCRIPTION OF THE INVENTION

EXAMPLE 1

Figure 1:
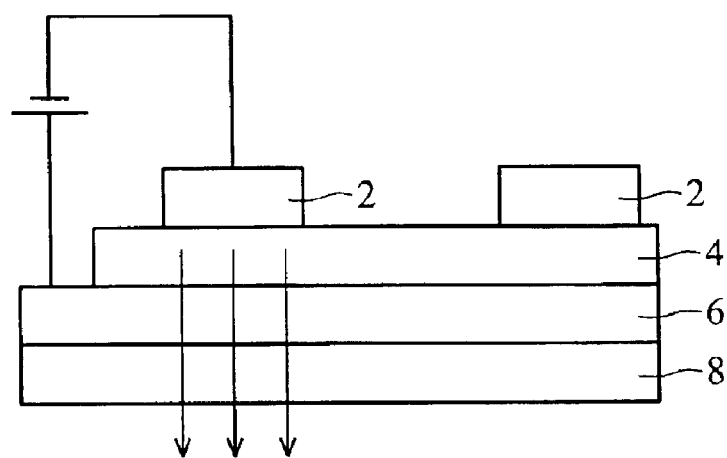
FIG. 1 illustrates the schematic structure of a single layer OLED device.
Figure 2:
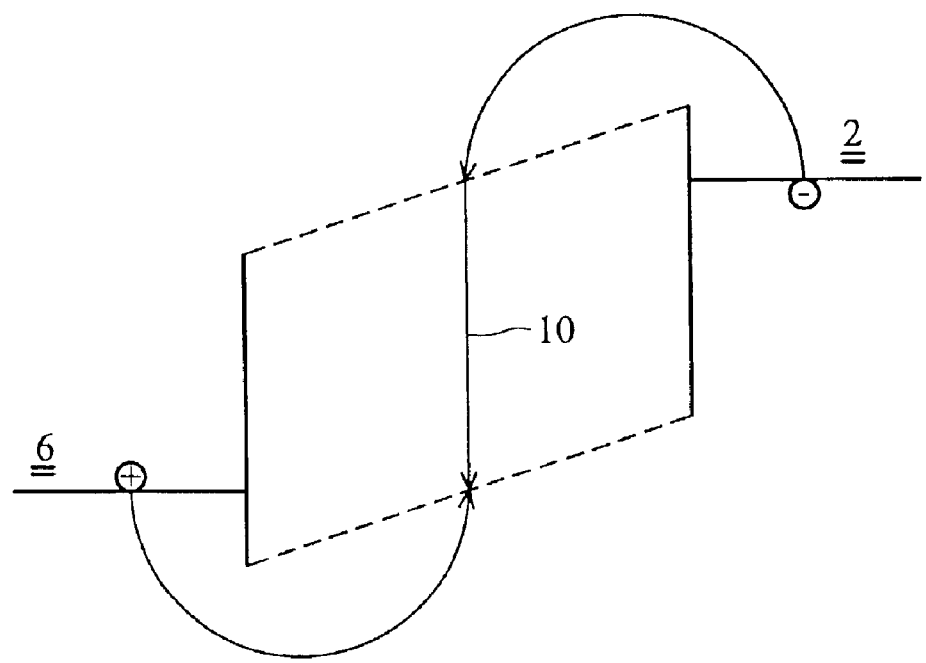
FIG. 2 illustrates the energy gap for the single layer OLED device shown in FIG. 1.
Figure 3:
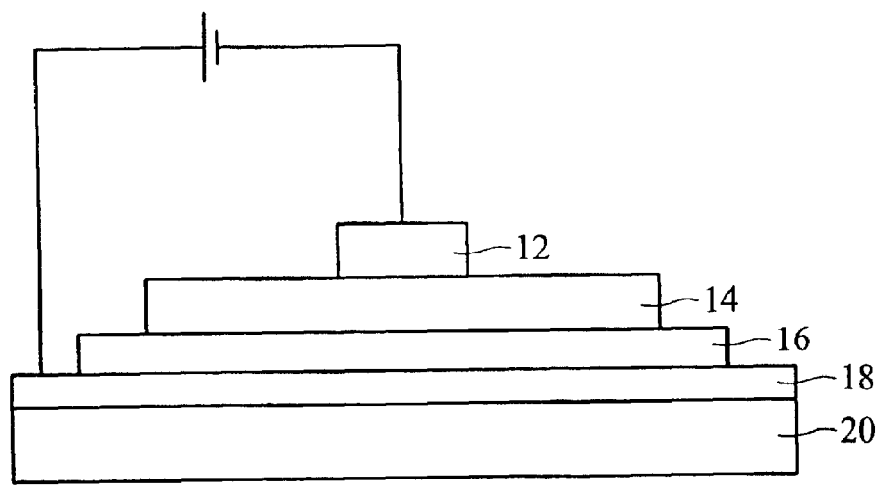
FIG. 3 is a cross-section of a double layer OLED device.
Figure 4A:
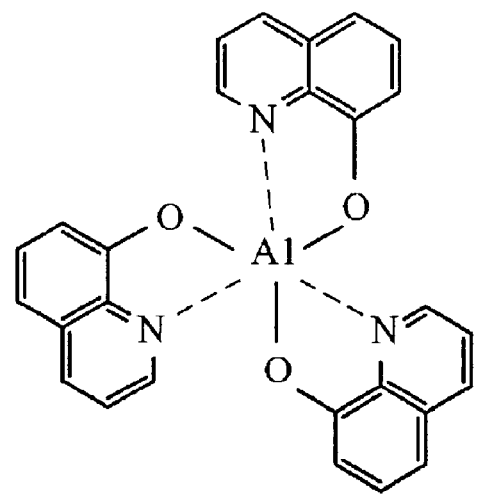
FIG. 4a illustrates the structural formula of $Alq_3$.
Figure 4B:
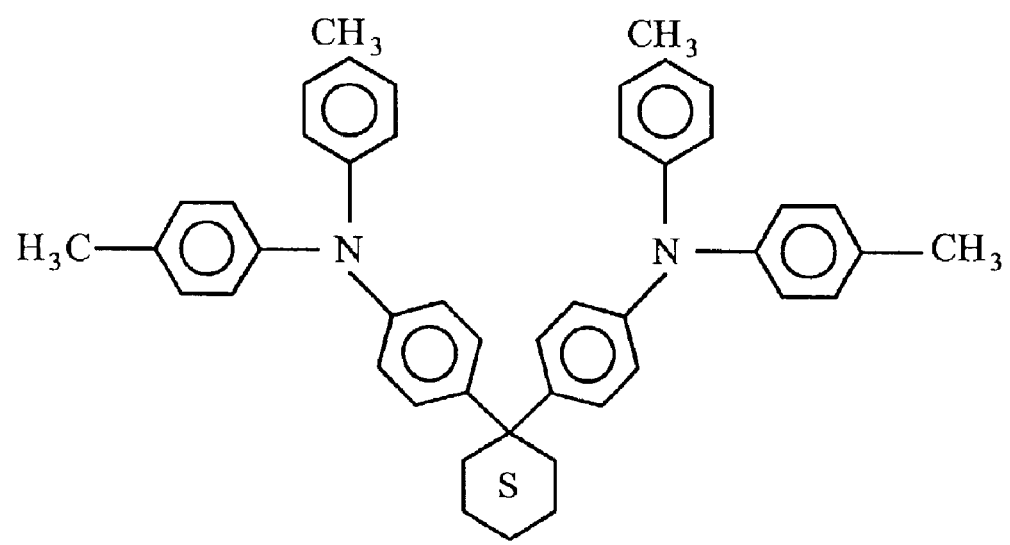
FIG. 4b illustrates the structural formula of diamine.
Figure 5:
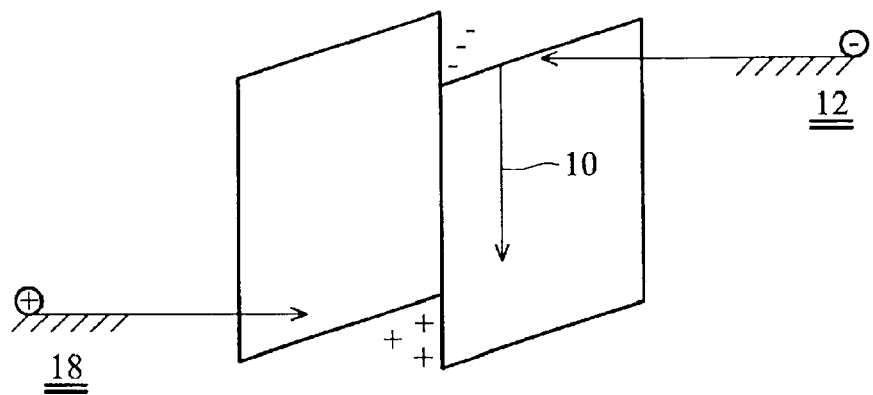
FIG. 5 represents the energy gap of the double layer OLED device shown in FIG. 3.

A preferred embodiment for the red-emitting organic electroluminescent compound is described in detail with reference to the accompanying diagram.

Diagram 1 illustrates the synthetic procedure of compound 5, as an example of the red-emitting organic electroluminescent compound.

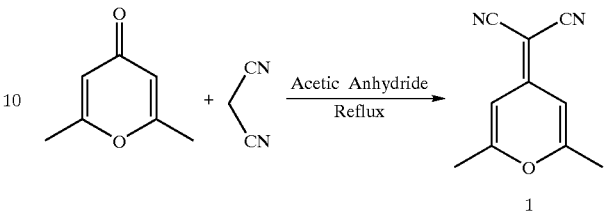

1

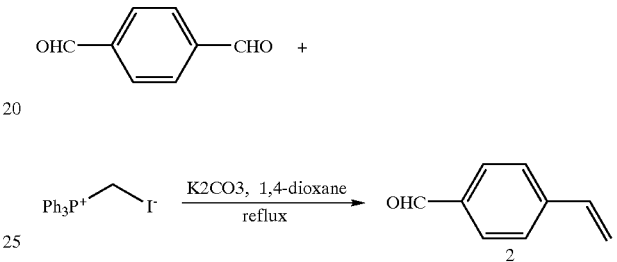

2

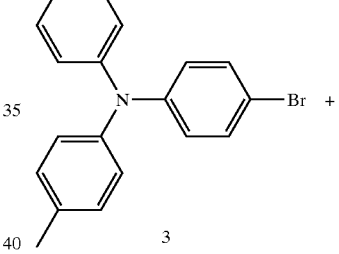

3

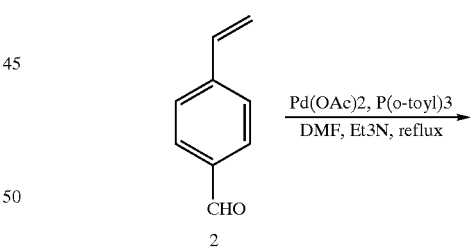

2

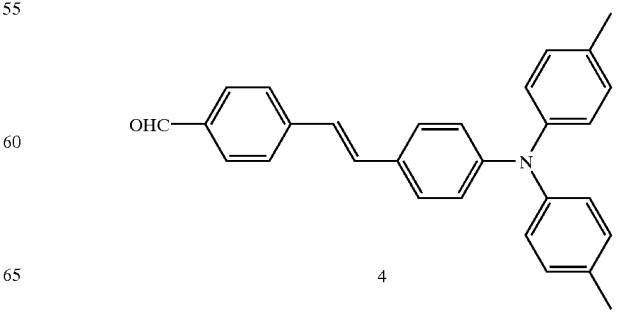

4

-continued

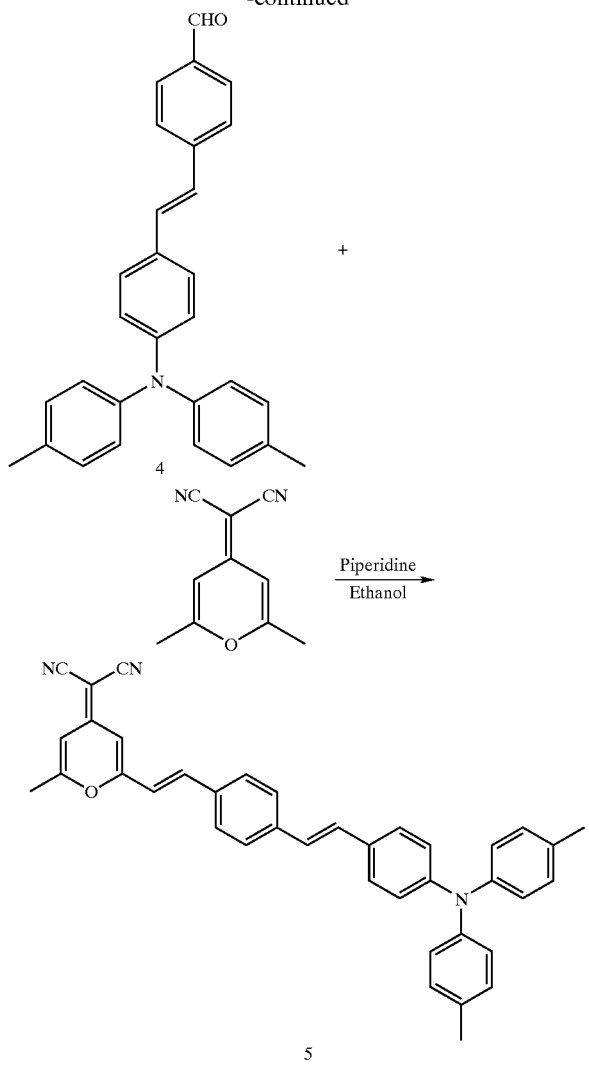

(1) Reactant 2,6-dimethyl-γ-pyrone (9.3 g, 75 mmol) and malononitril (6.6 g, 100 mmol) were weighed and placed in a double-neck beaker, followed by adding 50 acetic anhydride. The mixture was heated and refluxed to react for 8 hours, followed by cooling to room temperature. Next, the mixture was added to water to precipitate black-brown solids. Final product 1 was obtained by depressurized filtration of the solids. Methanol was then used for recrystallization to obtain compound 1 (10.3 g, yield=80%).

(2) Next, terephthaldicarboxaldehyde (5.44 g, 40 mmol) was placed in a 250 ml double-neck beaker, followed by adding 100 ml of 1,4-dioxane, 1.5 ml of $H_2O$ as solvent, $Ph_3P^+CH_3I$ (16.2 g, 40 mmol) and 9.0 g of potassium carbonate. The mixture was heated and refluxed for 24 hours. Solids were then filtered and removed. Next, silica gel was added into the filtrate and solvent was removed by depressurized condensation. The solution was then purified by column chromatograph, using 5% of ethyl acetate/hexane as gradient solution to obtain compound 2 (2.64 g, yield=50%).

(3) Compound 2 (3.35 g, 25 mmol) and compound 3 (4-bromo-4',4"-dimethyl-triphenylamine) (8.8 g, 25 mmol) were weighed and placed in a 500 ml double-neck beaker, followed by adding 150 ml of DMF and 90 ml of triethylamine as solvents and $Pd(OAc)_2$ (0.35 g, 1.5 mmol) and $P(o-tolyl)_3$ (1.97 g, 6.4 mmol) as catalysts. The mixture was heated and reacted in nitrogen gas for 24 hours. The obtained solution was added to water to precipitate solids. Next, yellow solid 1a was obtained by depressurized filtration. $MeOH/CH_2Cl_2$ was used for recrystallization to obtain product 4 (7.5 g, yield=75%).

(4) Compound 1 (1.72 g, 10 mmol) and compound 4 (2.02 g, 5 mmol) were placed in a 100 ml double-neck beaker, followed by adding 50 ml of ethanol and 1 ml of piperidine. The mixture was heated and refluxed to react for 24 hours. The solution was added to water to precipitate solids. Orange-red solids 5 were obtained by depressurized filtration. $MeOH/CH_2Cl_2$ was used for recrystallization to obtain product 5 (2.25 g, yield=81%). PL λ max=625 nm of compound 5 (measured by fluorescent spectrometer in $CHCl_3$ solution)

EXAMPLE 2

Figure 6:
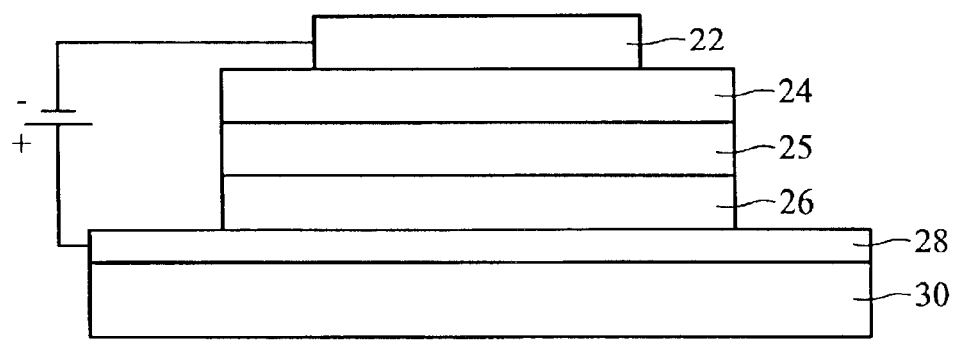
FIG. 6 is a schematic structural diagram of one example of the organic electroluminescent element according to the invention.

FIG. 6 illustrates a simplified structure of an organic electroluminescence device according to the invention. The device mainly comprised an cathode 22, electron-transport layer 24, organic luminance layer 25, hole-transport layer 26, anode 28 and substrate 30. Substrate 30 is the supporting layer of the device, which is made of glass or plastic. At least one layer of organic layer is interposed between the cathode 22 and the anode 28. In this example, the organic layer consists of electron-transport layer 24, organic luminescent layer 25 and hole-transport layer 26. Electron-transport layer 24 is placed next to the cathode 22 and electron hole-transport layer 26 is placed next to anode 28. Organic luminance lyaer 25 is placed between electron-transport layer 24 and hole-transport layer 26.

The organic electroluminance layer 25 can be the compound, at least including the following structural formula:

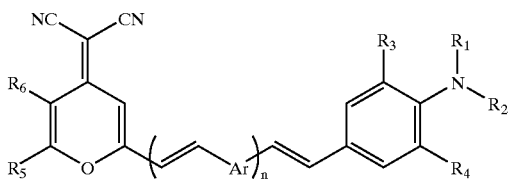

wherein n is an integer of 1~6; Ar represents aryl or heteroaryl; $R_1$ and $R_2$ individually represent alkyl of from 1 to 20 carbon atoms, aryl, carbocyclic and other heterocyclic systems;

$R_3$ and $R_4$ individually represent hydrogen, alkyl of from 1 to 10 atoms, branched or unbranched 5 or 6 member substituent ring connecting respectively with $R_1$ and $R_2$, or alkyl methyl silane group;

$R_5$ represents alkyl of from 1 to 20 atoms, aryl, or heteroaryl; and $R_6$ represents alkyl of from 1 to 10 atoms, and a 5 or 6-member carbocyclic ring connecting with $R_5$.

$R_1$ and $R_2$ can be methyl, ethyl, propyl, n-butyl, aryl or heteroaryl. Artyl or heteroaryl include substituted or unsubstituted phenyl, biphenyl, naphthyl, anthracenyl, furyl, thienyl, pyridinyl or other heteroaryls. $R_3$ and $R_4$ represent hydrogen atom, methyl, ethyl, propyl, iso-propyl, n-butyl, iso-butyl, neobutyl, neopentyl or $R_3$ and $R_4$ are arranged respectively with $R_1$ and $R_2$ as follows $R_1$–$R_3$, $R_2$–$R_4$= $[CH_2CH_2]$, $[CH_2CH_2CH_2]$, $[CH_2CH_2C(CH_3)_2]$. $R_5$ is methyl, ethyl, propyl, iso-propyl, n-butyl, iso-butyl, neobutyl, neopentyl or other aryl having greater three dimensional barrier, such as 1-naphthyl, 9-anthracenyl, pyrenyl, perylenyl, ortho-substituted aryl or substituted carbocyclic ring connecting $R_5$ and $R_6$, to form the following structure $R_5$, $R_6 = (-CH_2CH_2CH_2-)$ and $(-CH_2CH_2CH_2CH_2-)$.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A red-emitting organic electroluminescent compound of the formula:

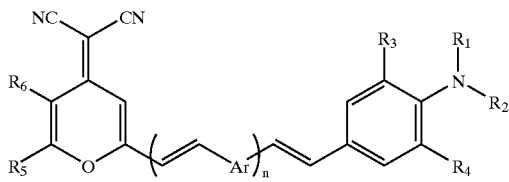

wherein n is an integer of 1~6;

wherein Ar is selected from a group consisting of an aryl, wherein the aryl is selected from the group consisting of a substituted or unsubstituted phenyl and a substituted or unsubstituted biphenyl;

wherein $R_1$ is selected from a group consisting of an alkyl of from 1 to 20 carbon atoms, and an aryl, wherein the aryl is selected from the group consisting of a substituted or unsubstituted phenyl and a substituted or unsubstituted biphenyl;

wherein $R_2$ is selected from a group consisting of an alkyl of from 1 to 20 carbon atoms and an aryl, wherein the aryl is selected from the group consisting of a substituted or unsubstituted phenyl and a substituted or unsubstituted biphenyl;

wherein $R_3$ is selected from a group consisting of a hydrogen, an alkyl of from 1 to 10 carbon atoms and a alkyl methyl silane group;

wherein $R_4$ is selected from a group consisting of a hydrogen, an alkyl of from 1 to 10 carbon atoms and a alkyl methyl silane group;

wherein $R_5$ is selected from a group consisting of an alkyl of from 1 to 20 carbon atoms, and an aryl, wherein the aryl is selected from the group consisting of a substituted or unsubstituted phenyl; and wherein $R_6$ is selected from the group consisting of an alkyl of from 1 to 10 carbon atoms.

2. The compound as claimed in claim 1, wherein $R_1$ is selected from a group consisting of methyl, ethyl, propyl and n-butyl and wherein $R_2$ is selected from a group consisting of methyl, ethyl, propyl and n-butyl.

3. The compound as claimed in claim 1, wherein $R_3$ and $R_4$ are independently selected from the group consisting of a hydrogen, a methyl, an ethyl, a propyl, an isopropyl, a n-butyl, an iso-butyl, a neobutyl and a neopentyl.

4. The compound as claimed in claim 1, wherein $R_5$ is selected from the group consisting of a methyl, an ethyl, a propyl, an iso-propyl, a n-butyl, an iso-butyl, a neobutyl and a neopentyl.

* * * * *